(12) United States Patent
Ok et al.

(10) Patent No.: US 12,329,045 B2
(45) Date of Patent: Jun. 10, 2025

(54) PHASE CHANGE MEMORY PROGRAMMING CURRENT LEAKAGE REDUCTION

(71) Applicant: International Business Machines Corporation, Armonk, NY (US)

(72) Inventors: Injo Ok, Loudonville, NY (US); Soon-Cheon Seo, Glenmont, NY (US); Alexander Reznicek, Troy, NY (US); Youngseok Kim, Upper Saddle River, NJ (US); Timothy Mathew Philip, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 638 days.

(21) Appl. No.: 17/543,957

(22) Filed: Dec. 7, 2021

(65) Prior Publication Data

US 2023/0180639 A1 Jun. 8, 2023

(51) Int. Cl.
*H10N 70/20* (2023.01)
*H10N 70/00* (2023.01)

(52) U.S. Cl.
CPC ......... *H10N 70/231* (2023.02); *H10N 70/011* (2023.02); *H10N 70/826* (2023.02); *H10N 70/8616* (2023.02)

(58) Field of Classification Search
CPC ..................................................... H10N 70/00
See application file for complete search history.

(56) References Cited

U.S. PATENT DOCUMENTS

| | | | |
|---|---|---|---|
| 8,106,376 B2 | 1/2012 | Lai |
| 8,212,231 B2 | 7/2012 | Chen |
| 8,288,750 B2 | 10/2012 | Shen |
| 8,305,800 B2 | 11/2012 | Tu |
| 10,050,194 B1 | 8/2018 | Nardi |
| 10,505,111 B1 | 12/2019 | Ok |
| 10,714,684 B2 | 7/2020 | Cheng |
| 10,832,941 B2 | 11/2020 | Seo |

*Primary Examiner* — Marvin Payen
(74) *Attorney, Agent, or Firm* — Matthew Zehrer

(57) ABSTRACT

A semiconductor device includes a PCM stack that includes bottom electrode liner over a lower heater. The bottom electrode liner has a top-down view plus (+) geometry with a 'horizontal' portion being orthogonal to a 'vertical' portion. An airgap is formed within the PCM stack in an area located adjacent and between the 'horizontal' portion and the 'vertical' portion. The airgap has a substantially smaller dielectric constant than the surrounding PCM stack material(s). Therefore, the airgap may effectively reduce the amount of current that leaks from the PCM stack when flowing from the bottom electrode liner to a top contact or top electrode. Further, the airgap may allow for expansion of the surrounding PCM stack material(s) that may result from the heating of the PCM stack.

20 Claims, 11 Drawing Sheets

PHASE CHANGE MEMORY PROGRAMMING CURRENT LEAKAGE REDUCTION

BACKGROUND

Various embodiments of the present application generally relate semiconductor device fabrication methods and resulting structures. More specifically the various embodiments may relate to a phase change memory (PCM) semiconductor device that includes one or more airgap(s) or air pocket(s) next to the PCM stack.

SUMMARY

According to an embodiment of the present invention, a semiconductor device is presented. The semiconductor device includes a dielectric layer and a bottom heater within the dielectric layer. The semiconductor device further includes a phase change memory stack. The phase change memory stack includes a bottom projection liner electrode upon the dielectric layer and upon the bottom heater, a phase change memory material upon the bottom projection liner electrode, and a top electrode upon the phase change memory material. The phase change memory stack further includes an airgap opening entirely through the top electrode and entirely through the phase change material. The airgap opening exposes a portion of the top surface of the dielectric layer. The phase change memory stack further includes an airgap within the airgap opening.

According to an embodiment of the present invention, another semiconductor device is presented. The semiconductor device includes a dielectric layer and a bottom heater within the dielectric layer. The semiconductor device further includes a phase change memory stack. The phase change memory stack includes a bottom projection liner electrode upon the dielectric layer and upon the bottom heater. The bottom projection liner electrode includes a top-down view horizontal portion and a top-down view vertical portion that is orthogonal to the top-down view horizontal portion. The phase change memory stack further includes phase change memory material upon the bottom projection liner electrode and a top electrode upon the phase change memory material. The phase change memory stack further includes a first pair of airgaps within the phase change memory stack diagonally located between the top-down view vertical portion and the top-down view horizontal portion of the bottom projection liner electrode.

According to another embodiment of the present invention, a semiconductor device fabrication method is presented. The method includes forming a heater within a dielectric layer, forming a bottom projection liner electrode upon the heater and upon the dielectric layer, forming a phase change memory upon the bottom projection liner electrode and upon the dielectric layer, forming a top electrode upon the phase change memory, forming an airgap opening entirely through the top electrode and entirely through the phase change memory to expose a portion of a top surface of the dielectric layer, and forming an encapsulation layer within an inlet of the airgap opening to form an airgap within the airgap opening.

These and other embodiments, features, aspects, and advantages will become better understood with reference to the following description, appended claims, and accompanying drawings.

DETAILED DESCRIPTION

Phase-change memory (PCM) is a type of non-volatile computer memory, which uses the unique behavior of phase-change materials such as chalcogenide glass. With the application of heat, the chalcogenide glass can be switched between two states, i.e., crystalline and amorphous states. The crystalline and amorphous states of chalcogenide glass have dramatically different electrical resistivity, and this forms the basis by which data are stored.

Figure 1:
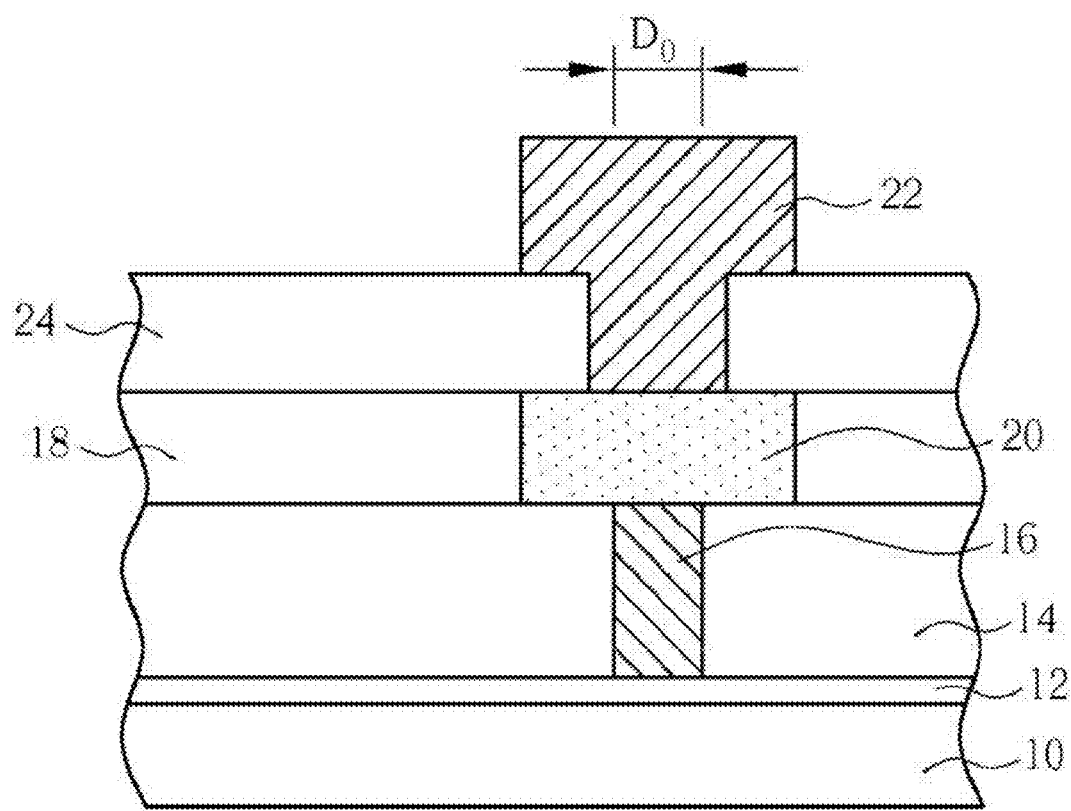
FIG. 1 is a schematic diagram showing a cross-sectional view of a conventional phase-change memory cell structure.

FIG. 1 is a schematic diagram showing a cross-sectional view of a conventional phase-change memory cell structure. As shown in FIG. 1, the phase-change memory cell structure includes a silicon substrate 10 with a bottom electrode 12 thereon. A dielectric layer 14 is formed over the bottom electrode 12 and a heating electrode 16 is formed in the dielectric layer 14. A patterned phase-change material layer 20 is provided on the dielectric layer 14. The patterned phase-change material layer 20 may be formed in a dielectric layer 18. A bottom surface of the phase-change material layer 20 partially contacts the heating electrode 16. A dielectric layer 24 is formed over the dielectric layer 18 and a top electrode 22 is formed over and in the dielectric layer 24, thereby contacting the phase-change material layer 20. During memory cell operation, a large amount of current flows through the heating electrode 16 to heat up an interface between the phase-change material layer 20 and the heating electrode 16, thereby transforming the phase of the phase-change material layer 20.

Currently, to enhance applications of phase-change memory devices, size of the memory cell(s) is being further reduced. With size reduction of the memory cell, however, it also means working current of the memory cells should also be reduced while increasing memory cell density. One challenge for current phase-change memory technology has been the requirement of high programming current density in the active volume for switching the state of the phase-change material during a write operation. One approach is reducing the contact surface area between the heating electrode 16 and the phase change material layer 20, such as through reducing a diameter Do of the heating electrode 16, thereby maintaining adequate current density at the interface. However, diameter scalability of the heating electrode 16 is limited by ability of current photolithography.

The interface between the phase-change material layer 20 and the adjacent dielectric 18 is another fundamental concern. The dielectric 18 may begin to leak current at higher temperature or may lose adhesion when expanding at a different rate from the phase-change material layer 20.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, a PCM generally includes two electrodes separated by a phase change material, such as chalcogenide glass. This PCM utilizes the wide range of resistance values available for the active chalcogenide glass as the basis of memory operation. Each resistance value corresponds to a distinct structural state of the chalcogenide glass and one or more of the states can be selected and used to define operational memory states. Chalcogenide glass exhibit a crystalline state or phase as well as an amorphous state or phase.

Different structural states of a chalcogenide glass differ with respect to the relative proportions of crystalline and amorphous phase in a given volume or region of chalcogenide glass. The range of resistance values is bounded by a set state and a reset state of the chalcogenide glass. The set state is a low resistance structural state whose electrical properties are primarily controlled by the crystalline portion of the chalcogenide glass and the reset state is a high resistance structural state whose electrical properties are primarily controlled by the amorphous portion of the chalcogenide glass.

By measuring a current through the chalcogenide glass, the resistance across the chalcogenide glass can be determined and associated with a data value stored in the PCM cell. Typically, the set state or low resistance structural state is considered to mean the PCM cell stores a "1," while the reset state or the high resistance structural state is considered to mean the PCM cell stores a "0".

One or more embodiments of the invention also provide fabrication methods and resulting devices that include an dual a PCM stack that includes a phase change material layer, such as a chalcogenide glass layer. The phase change material layer has one or more openings therein in which an air-gap or air-pocket may be formed. The air-gap may reduce current leakage, may improve confinement of current flow through the phase change material layer of the PCM stack, and/or may provide a region for the phase change material layer to expand as a result of heating.

Figure 2:
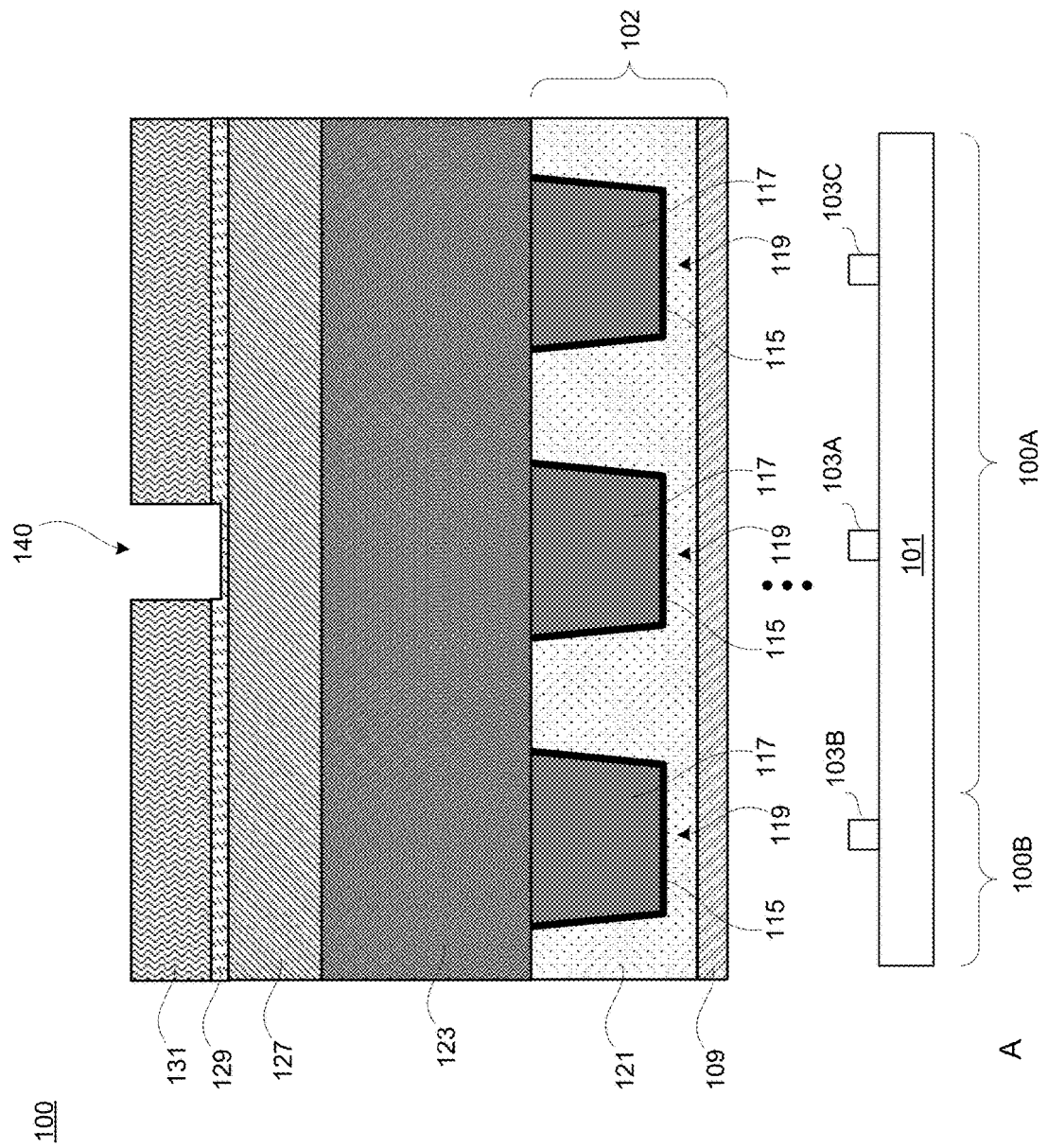
FIG. 2 through FIG. 10 depict cross-sectional views of a semiconductor device shown after respective fabrication operations, in accordance with one or more embodiments.
Figure 3:
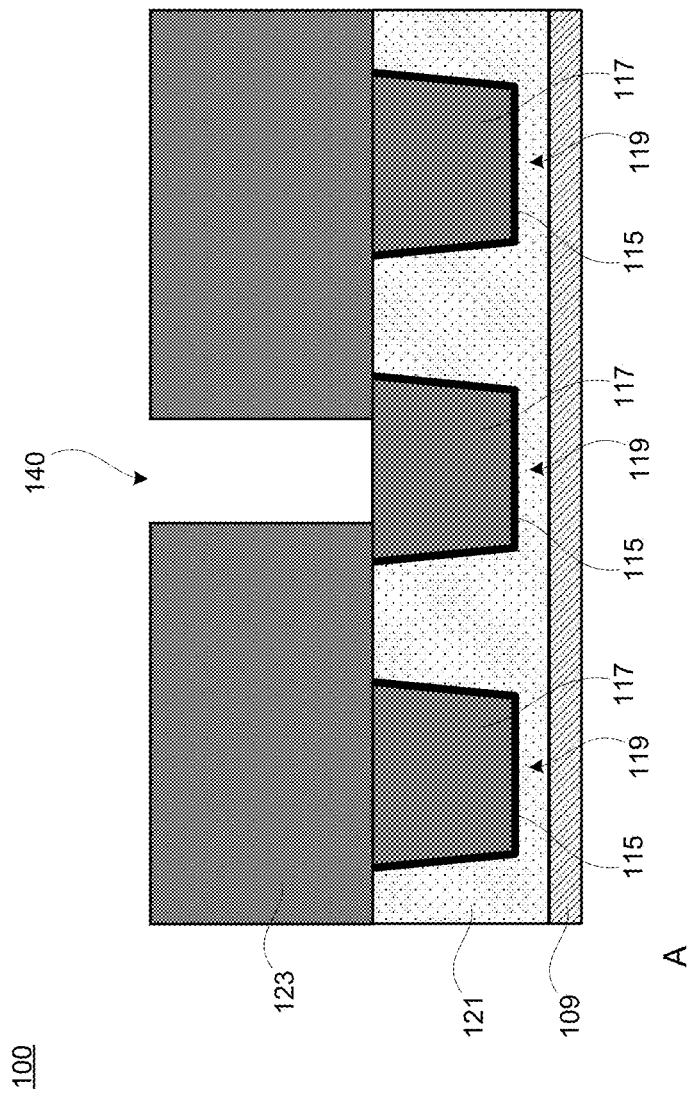

FIGS. 2 through 11 are cross-sectional views of intermediate stages in the formation of a semiconductor device 100 in accordance with some embodiments. Referring to FIG. 2, the semiconductor device 100 may include a substrate 101, a metallization layer(s) Mx 102, a dielectric layer 123, and/or patterning layers 127, 129, 131.

The substrate 101 may be a semiconductor substrate, such as silicon, doped or undoped, an active layer of a semiconductor-on-insulator (SOI) substrate, or the like. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Electrical components 103A, 103B, 103C may be, e.g., transistors, diodes, capacitors, resistors, or the like, formed by any suitable formation method.

In some embodiments, a plurality of metallization layers are formed over the substrate 101 and the electrical components 103A, 103B, 103C. The metallization layers may be denoted as Mx, where x=0, 1, 2, . . . , where M0 refers to the lowest (e.g., closest to the substrate 101) metallization layer, and the index x increases by 1 for each additional metallization layer. The metallization layer M0 comprises one or more Inter-Layer Dielectric (ILD) layers and electrically conductive features, such as contact plugs, within the ILD layer(s) that may electrically connect to the electrical components 103A, 103B, 103C. The metallization layer Mx (with x greater or equal to 1) may comprise an Inter-Metal Dielectric (IMD) layer and electrically conductive features (e.g., metal lines and vias) within the IMD layer. In some embodiments, electrically conductive features, such as conductive lines, vias, or the like, provide electrical connection to underlying conductive features.

The ILD layer(s) and the IMD layers may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), NBLOK, or the like. The ILD layer(s) and the IMD layers may be formed by any acceptable deposition process, such as spin coating, physical vapor deposition (PVD), chemical vapor deposition (CVD), the like, or a combination thereof. The electrically conductive features in the ILD layer(s) and the IMD layers may be formed through any suitable process, such as deposition, damascene, dual damascene, the like, or combinations thereof.

In a particular implementation, FIG. 2 illustrates metallization layer Mx 102 over the substrate 101. In some embodiments, the metallization layer Mx may be the metallization layer M0 and may contact the substrate 101. In other embodiments, other metallization layers may be interposed between the metallization layer Mx 102 and the substrate 101. For simplicity, in subsequent figures, the substrate 101 and the electrical components 103A, 103B, 103C may not be illustrated.

In some embodiments, the metallization layer Mx 102 comprises a dielectric layer(s) 109, 121, etc., and conductive features 119 within the dielectric layer(s) 121, 109, etc. In some embodiments, a bottom dielectric layer (not shown) is a low-k dielectric layer having a k value lower than about 3.0, TEOS oxide (silicon oxide deposited using, e.g., a Chemical Vapor Deposition (CVD) method with Tetra Ethyl Ortho Silicate (TEOS) as a precursor), or the like.

The dielectric layer 121 may be formed of a low-k dielectric material with a k value lower than about 3.0, for example and may be formed using CVD, Physical Vapor Deposition (PVD), or the like. The dielectric layer 123 may further be TEOS, PSG, BSG, BPSG, Undoped Silicate Glass (USG), Fluorosilicate Glass (FSG), SiOCH, flowable oxide, a porous oxide, SiN, SiC, nitrogen doped SiC (SiCN), Nitrogen and Hydrogen doped SiC (SiCNH) or the like, or combinations thereof.

In some embodiments, a cap layer 109 may be formed between the bottom dielectric layer 105 and the dielectric layer 121. In some embodiments, the cap layer 109 is formed of a dielectric layer that is different from the overlying dielectric layer 121. For example, the cap layer 109 may be formed of TEOS oxide, aluminum oxide, silicon oxide, silicon nitride, silicon oxynitride, silicon carbide, a combination thereof, or the like. The cap layer 109 may also be a composite layer formed of a plurality of dielectric layers. For example, the cap layer 109 may include one or more layers of SiC, SiN, Nitrogen doped SiC (SiCN) or Nitrogen and Hydrogen doped SiC (SiCNH), or the like. The cap layer 109 may be formed using CVD, Physical Vapor Deposition (PVD), or the like.

The conductive features 119 may be formed of metals such as copper, aluminum, tungsten, cobalt, metal alloys thereof, or the like. In some embodiments where the metallization layer Mx 102 is the metallization layer M0, the conductive features 113, 119 are contact plugs and conductive features 125 there above, respectively, may be metal lines (such as word lines or bit lines), metal contacts, doped semiconductor strips, or the like. In other embodiments where the metallization layer Mx is a metallization layer with x greater than 1, as depicted, the conductive features 113, 119 may be metal lines, doped semiconductor strips, or the like.

In some embodiments, conductive features 119 include conductive regions 117 and conductive barrier layer(s) 115 lining sidewalls and bottom surfaces of the conductive regions 117. The conductive barrier layer(s) 115 may be formed of titanium (Ti), titanium nitride (TiN), tantalum (Ta), tantalum nitride (TaN), cobalt (Co), a combination thereof, or the like. The conductive regions 117 may be formed of metals such as copper, aluminum, tungsten, cobalt, alloys thereof, or the like. The conductive regions 117 may also be conductive semiconductor materials such as a P-type doped semiconductor material, N-type doped semiconductor material, or the like. In some implementations, a single conductive feature 119 may be formed and may be a top layer of metallization layer Mx 102.

In other implementations, conductive feature(s) 119 may be vertical interconnect access (VIAs), metal wiring lines, or the like, which may be formed by etching the dielectric layer(s) 121, etc. to form appropriate opening(s), forming conductive barrier layer(s) 115 extending into the opening(s), depositing conductive region 117 material over the blanket conductive barrier layer(s) 115, and performing a planarization process, such as a CMP process or a mechanical grinding process, to remove excess portions of the blanket conductive barrier layer(s) 115 and the conductive region 117 material.

One or more patterning layer(s) 127, 129, 131 may be sequentially formed over the dielectric layer 123. Patterning layer 127 may be an organic planarization layer (OPL), patterning layer 129 may be a Silicon containing Anti-Reflective Coating (SiARC) layer, and/or patterning layer 131 may be a photoresist layer. Known photolithography and etching process are carried out to form opening(s) 140 first in the patterning layer(s) 127, 129, 131, and subsequently in the dielectric layer 123, as is exemplarily depicted in FIG. 3. The opening(s) 140 may be formed entirely through the dielectric layer 123 and each of the openings 140 may at least partially expose at least a part of an underlying conductive feature(s) 119. Subsequently, the one or more patterning layer(s) 127, 129, 131 may be removed from the dielectric layer 123.

Figure 4:
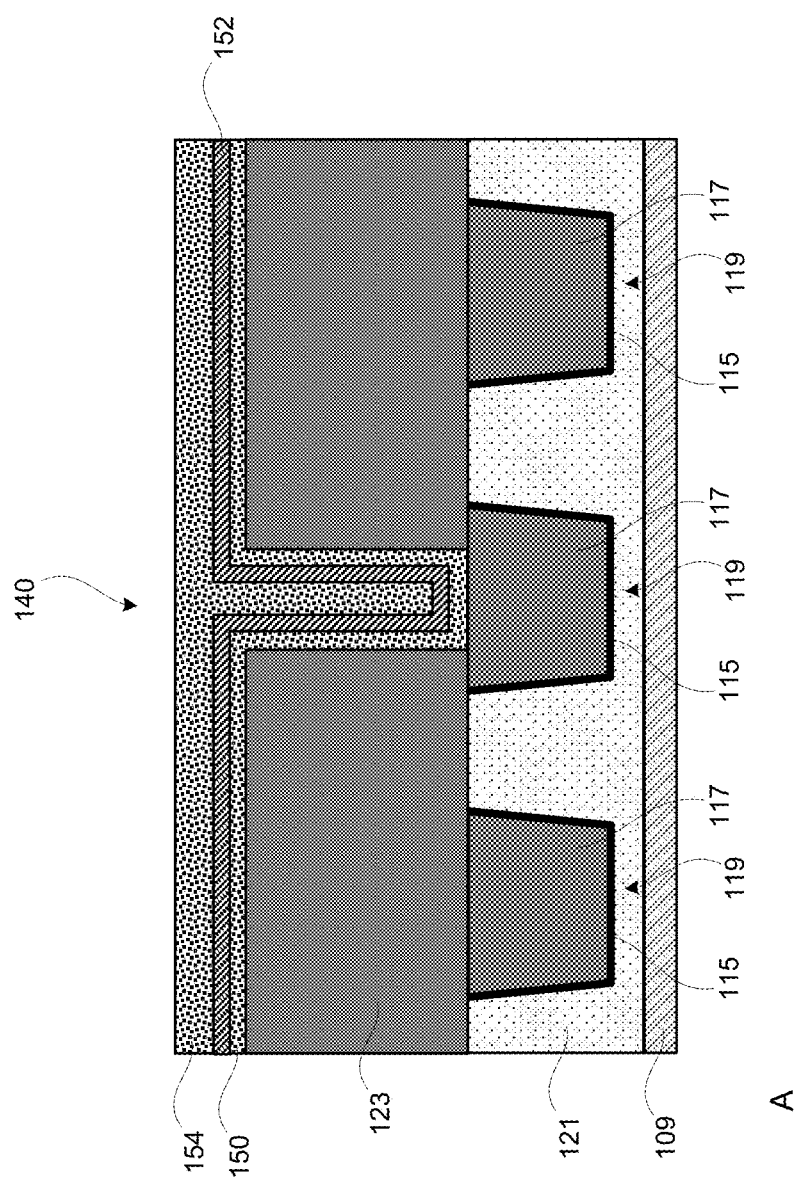

FIG. 4 depicts a cross-sectional view of semiconductor device 100 shown after a respective fabrication operation(s). In the present fabrication operation(s), heater layer(s) 150, 152, 154 may be formed upon dielectric layer 123 and may be formed upon the exposed portion(s) of the underlying conductive feature(s) 119 within opening 140.

A heater layer 150 of conductive material may be blanketly deposited over the dielectric layer 123, over the sidewalls of the opening 140, and over the exposed portion(s) of the underlying conductive feature(s) 119. Heater layer 150 may be a metal layer such as a titanium (Ti) layer, titanium nitride (TiN) layer, tantalum (Ta) layer, tantalum nitride (TaN) layer, cobalt (Co) layer, tungsten (W) layer, or the like. In an implementation, a single heater layer 150 may be blanket deposited over the dielectric layer 123, over the sidewalls of the opening 140, and over the exposed portion(s) of the underlying conductive feature(s) 119, such that the single heater layer 150 fills the opening 140. Heater layer 150 may have a thickness in the range between about 1 nm and about 10 nm, although other thicknesses are contemplated in the scope.

A heater layer 152 of conductive material may be blanketly deposited over the heater layer 150. Heater layer 152 may be a metal layer such as a titanium (Ti) layer, titanium nitride (TiN) layer, tantalum (Ta) layer, tantalum nitride (TaN) layer, cobalt (Co) layer, tungsten (W) layer, or the like, which is different that heater layer 150. In an implementation, a dual heater layer 150 and heater layer 152 may be blanket deposited over the dielectric layer 123, over the sidewalls of the opening 140, and over the exposed portion(s) of the underlying conductive feature(s) 119, such that the dual heater layer 150 and heater layer 152 fills the opening 140. Heater layer 152 may have a thickness in the range between about 1 nm and about 10 nm, although other thicknesses are contemplated in the scope.

A heater layer 154 of conductive material may be blanketly deposited over the heater layer 152. Heater layer 154 may be a metal layer such as a titanium (Ti) layer, titanium nitride (TiN) layer, tantalum (Ta) layer, tantalum nitride (TaN) layer, cobalt (Co) layer, tungsten (W) layer, or the like, which is different that heater layer 152 and which may be the same as heater layer 150. In an implementation, as depicted, a tri-layer of heater layers 150, 152, and 154 may be blanket deposited over the dielectric layer 123, over the sidewalls of the opening 140, and over the exposed portion(s) of the underlying conductive feature(s) 119, such that the tri-layer of heater layers 150, 152, and 154 fills the opening 140. Heater layer 154 may have a thickness in the range between about 2 nm and about 50 nm, although other thicknesses are contemplated in the scope.

Figure 5:
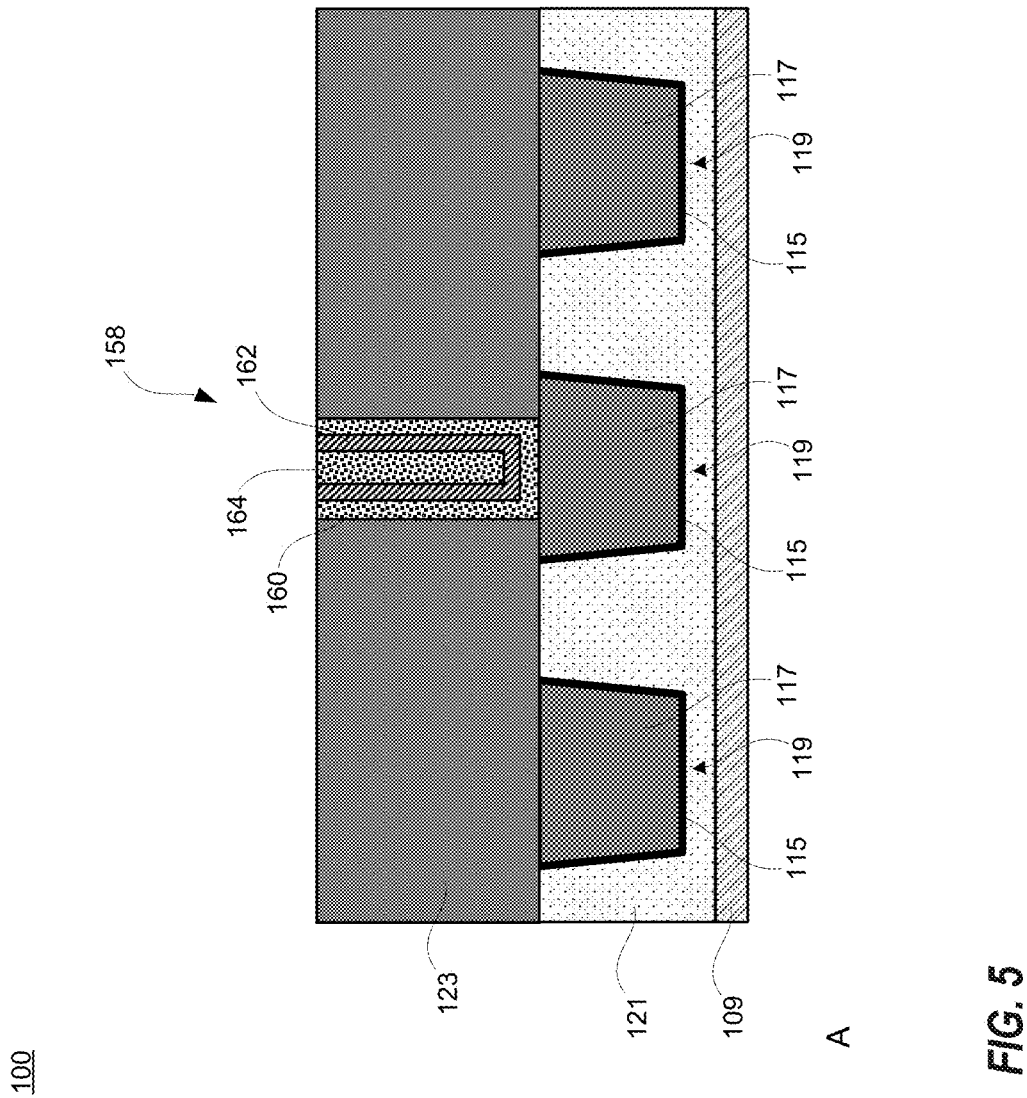

FIG. 5 depicts a cross-sectional view semiconductor device 100 shown after a respective fabrication operation(s). In the present fabrication operation(s), undesired or excess portion(s) of heater layer(s) 150, 152, 154 may be removed. For example, the portion(s) of the heater layer(s) 150, 152, and/or 154 outside the opening(s) 140 and above the dielectric layer 123 may be removed by a planarization process such as a chemical mechanical polishing (CMP) process. Such removal may leave or otherwise effectively form a conductive lower electrode 158 in each of the opening(s) 140 and may expose a top surface of the conductive electrode 158. The lower conductive electrode 150 may be referred to as a PCM bottom or lower heater, a PCM bottom or lower electrode, or the like. According to the depicted embodiment, the conductive electrode 158 may comprise a heater liner 160 which may be a retained portion of heater layer 150, a heater liner 162 which may be a retained portion of heater layer 152, and a heater plug 164 which may be a retained portion of heater layer 154.

In other implementations, the conductive electrode 158 may alternatively be formed of a doped semiconductor material, such as doped polysilicon, doped Si, doped SiGe, or the like.

Figure 6:
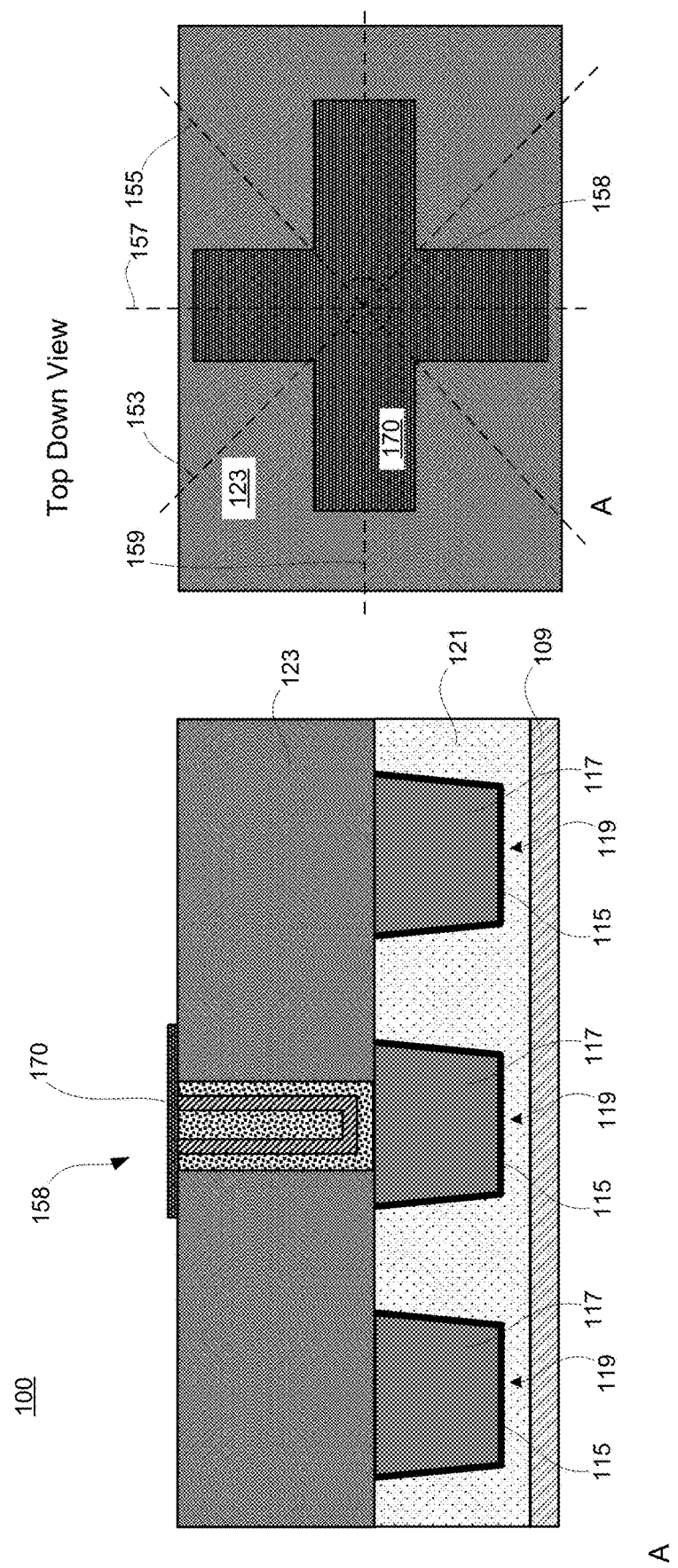

FIG. 6 depicts a cross-sectional view semiconductor device 100 shown after a respective fabrication operation(s). In the present fabrication operation(s), a bottom electrode liner 170 is formed over the conductive electrode 158 and over the dielectric layer 123.

In some embodiments, the bottom electrode liner 170 is formed as a blanket layer directly upon the top surface of dielectric layer 123, and may be formed using CVD, Physical Vapor Deposition (PVD), Electro-Chemical Plating (ECP), Electroless plating, or the like. The material of the bottom electrode liner 170 may include Cu, Al, Ti, Ta, W, Pt, Ni, Cr, Ru, TiN, TaN, combinations thereof, multi-layers thereof, or the like. In an embodiment where the bottom electrode liner 170 comprises a multilayer, the bottom electrode liner 170 may comprise a first layer and a second layer over the first layer. In some embodiments, the first layer has a thickness between about 1 nm and 10 nm. In some embodiments, the second layer has a thickness between about 1 nm and 10 nm. In some embodiments, bottom electrode liner 170 has a thickness between about 1 nm and 20 nm.

Utilizing known patterning, etching, or other material removal techniques, undesired portions of the blanket bottom electrode liner 170 may be removed with desired portions of the blanket bottom electrode liner 170 generally over the conductive electrode 158 may be retained, thereby forming the bottom electrode liner 170. The bottom electrode liner 170 may be formed to generally have a plus (e.g., +) top-down view geometry, as is exemplarity depicted in the top-down view of FIG. 6. This plus geometry may have intersecting and integral orthogonal top-down view portions with symmetry across one or more orthogonal diagonal bisecting planes 153, 155 and with symmetry across orthogonal bisecting planes 157, 159. Bisecting plane 159 is generally orthogonal to bisecting plane 157 and may be arranged into and out of the page, as depicted. Similarly, diagonal bisecting plane 153 is generally orthogonal to diagonal bisecting plane 155 and may also be arranged into and out of the page, as depicted. The diagonal bisecting planes 153, 155, may be forty-five degrees from the bisecting planes 157, 159. The diagonal bisecting plane 155 may define the A cross-section of semiconductor structure 100 as depicted in FIGS. 2-9.

The bottom electrode liner 170 may be centrally aligned with the underlying conductive electrode 158. For example, the bottom electrode liner 170 may be formed over the conductive electrode 158 such that a center of the conductive electrode 158 is coincident with at least both two or more planes 153, 155, 157, and/or 159.

Figure 7:
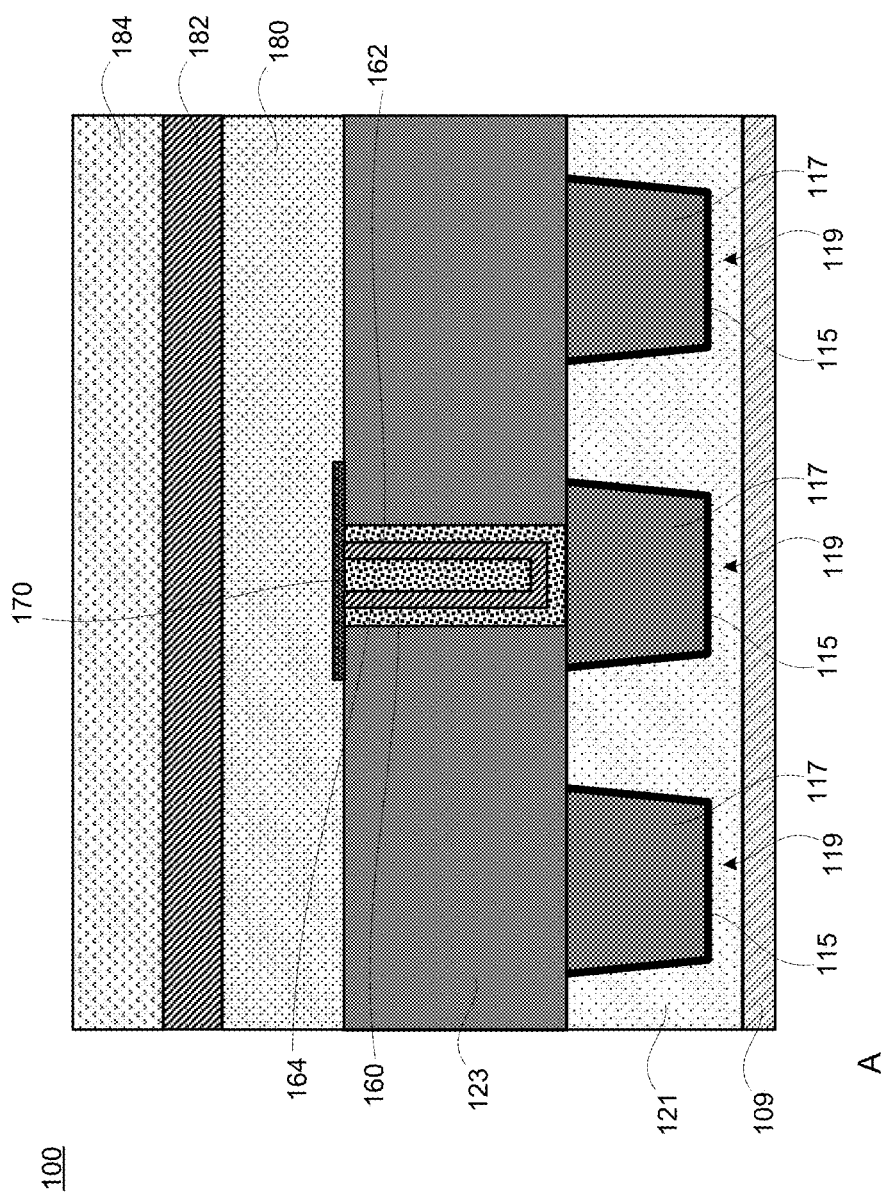

FIG. 7 depicts a cross-sectional view semiconductor device 100 shown after a respective fabrication operation(s). In the present fabrication operation(s), a phase change material layer 180 is formed over the bottom electrode liner 170 and over the dielectric layer 123, a top electrode layer 182 is formed over the phase change material layer 180 and a mask layer 184 is formed over the top electrode layer 182.

A known deposition process may be utilized to deposit a blanket phase change material layer 180 over the dielectric layer and over the bottom electrode liner 170, such as a PVD, CVD, or the like. The phase change material layer 180 may comprise chalcogenide materials such as Ge, Sb, Te trinary chalcogenide compounds, Te, Sb binary chalcogenide compounds, $SiO_2$, $N_2$, or other known phase change memory material(s). In some embodiments, phase change material layer 180 has a thickness between about 5 nm and 100 nm.

Top electrode layer 182 may be formed over the phase change material layer 180. In some embodiments, the top electrode layer 182 is formed as a blanket layer, and may be formed using CVD, PVD, ECP, electroless plating, or the like. The material of the top electrode layer 182 may include aluminum, titanium, tantalum, tungsten, alloys thereof, multi-layers thereof, or the like.

In an embodiment where top electrode layer 182 comprises a multilayer, the top electrode layer 182 may comprise a first layer, a second layer over the first layer, and a third layer over the second layer, with the first layer being made of Ta, the second layer being made of TaN, and the third layer being made of Ta. In some embodiments, the first layer has a thickness between about 5 nm and 100 nm. In some embodiments, the second layer has a thickness between about 5 nm and 100 nm. In some embodiments, the third layer has a thickness between about 20 nm and 300 nm. In some embodiments, the top electrode layer 182 has a thickness between thickness between about 5 nm and 100 nm. In some embodiments, the thickness of the top electrode layer 182 is greater than the thickness of the bottom electrode liner 170.

After forming the top electrode layer 182, one or more masks 184 may be formed over the top electrode layer 182. In some embodiments, the one or more masks 184 may comprise one or more hard masks, a tri-layer mask, a combination thereof, or the like. In some embodiments, a hard mask layer is formed over the top electrode layer 182 and a tri-layer mask is formed over the hard mask layer. In some embodiments, the hard mask layer may comprise TiO, a TEOS oxide, SiN, SiCN, SiON, a combination thereof, or the like. In some embodiments, the mask layer 184 has a thickness between about 20 nm and 300 nm.

Figure 8:
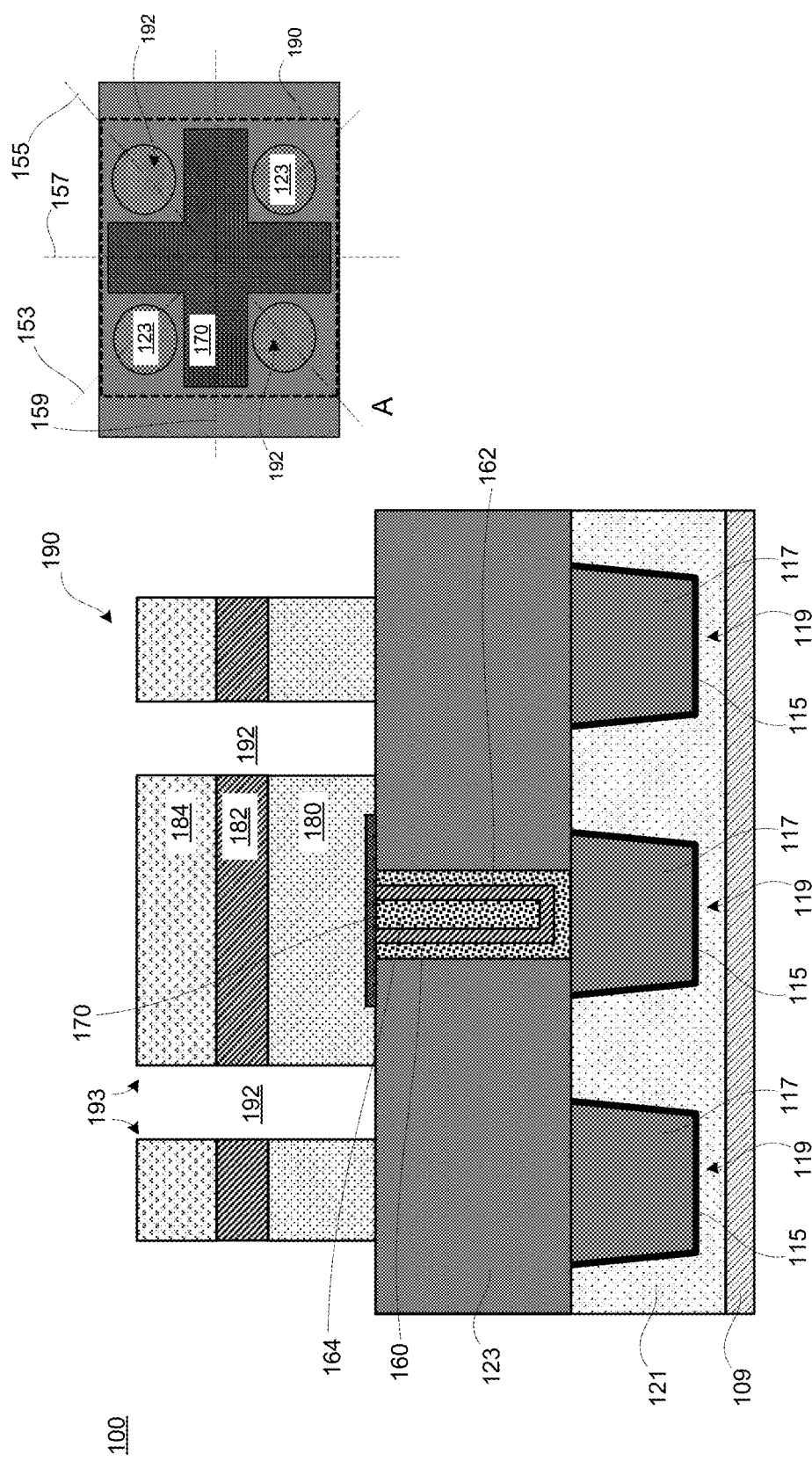

FIG. 8 depicts a cross-sectional view semiconductor device 100 shown after a respective fabrication operation(s). In the present fabrication operation(s), PCM stack 190 is formed by patterning mask layer 184, top electrode layer 182, and phase change material layer 180.

Utilizing known patterning and etching techniques, PCM stack 190 may be formed by removing portion(s) of mask layer 184, top electrode layer 182, and/or phase change material layer 180 while retaining other portions of mask layer 184, top electrode layer 182, and phase change material layer 180. As such, the formed PCM stack 190 may include the bottom electrode liner 170, retained phase change material layer 180, hereinafter referred to as phase change material 180, retained top electrode layer 182 material, hereinafter referred to as top electrode 182, and retained mask layer 184 material, hereinafter referred to as mask 184.

In some embodiments, PCM stack 190 may include substantially vertical sidewalls. For example, PCM stack 190 may include substantially vertical and parallel front and rear sidewalls, may include substantially vertical and parallel right and left sidewalls. In other embodiments, the PCM stack 190 has sloped sidewalls. In some embodiments, a width of the top electrode 182 is less than a width of the bottom electrode liner 170.

In embodiments, as depicted, respective sidewalls of the bottom electrode liner 170 may be inset relative to associated sidewalls of the PCM stack 190. For example, the rear sidewall of bottom electrode liner 170 is inset relative to the rear sidewall of PCM stack 190, the right sidewall of bottom electrode liner 170 is inset relative to the right sidewall of PCM stack 190.

In some embodiments, the patterning and etching processes that form PCM stack 190, may further form one or more openings 192 within the PCM stack 190. In one implementation, the PCM stack 190 is initially formed by a first patterning and etching process and the opening 192 may be subsequently formed by a second pattering and etching process. Alternatively, the PCM stack 190 and the opening 192 may be simultaneously formed during the same patterning and etching process.

A center of the PCM stack 190 may be coincident with the diagonal bisecting plane 153, 155, and/or may be coincident with the bisecting planes 157, 159.

As depicted in the top down view of FIG. 7, opening 192 may have a circular geometry, although other such geometries, such as ellipse, square, rectangle, are contemplated in the scope. The opening 190 may include substantially vertical internal sidewall(s), as depicted, may have sloped internal sidewall(s), etc. The internal sidewall(s) of opening 192 may include substantially coplanar phase change material 180 sidewall portion(s), top electrode 182 sidewall portion(s), and/or mask 184 sidewall portion (s). Opening may expose a portion of the top surface of dielectric layer 123. That is, a bottom surface of the opening 192 may be the top surface of the dielectric layer 123.

In embodiments, as depicted, each one or more formed opening(s) 192 is inset relative to the nearest sidewalls of the PCM stack 190. In other words, opening(s) 192 may be formed entirely within or entirely internal to the PCM stack 190 such that no portion of the opening(s) 192 form a perimeter sidewall of the PCM stack 190.

In some implementations, a pair of openings 192 may be located on the same diagonal bisector 153 and/or 155. For example, a respective center of a first pair of openings 192 may be each coincident with diagonal bisector 153 and a respective center of a second pair of openings 192 may be each coincident with diagonal bisector 155. In some embodiments, opening 192 may be between about 20 nm and 200 nm from a first orthogonal top-down vertical portion of the bottom electrode liner 170 and may be between about 20 nm and 200 nm from a second orthogonal top-down horizontal portion of the bottom electrode liner 170.

In some embodiments, the one or more PCM stack 190 formation and/or opening 192 formation etching processes may include a plasma etching method, such as an IBE process.

Figure 9:
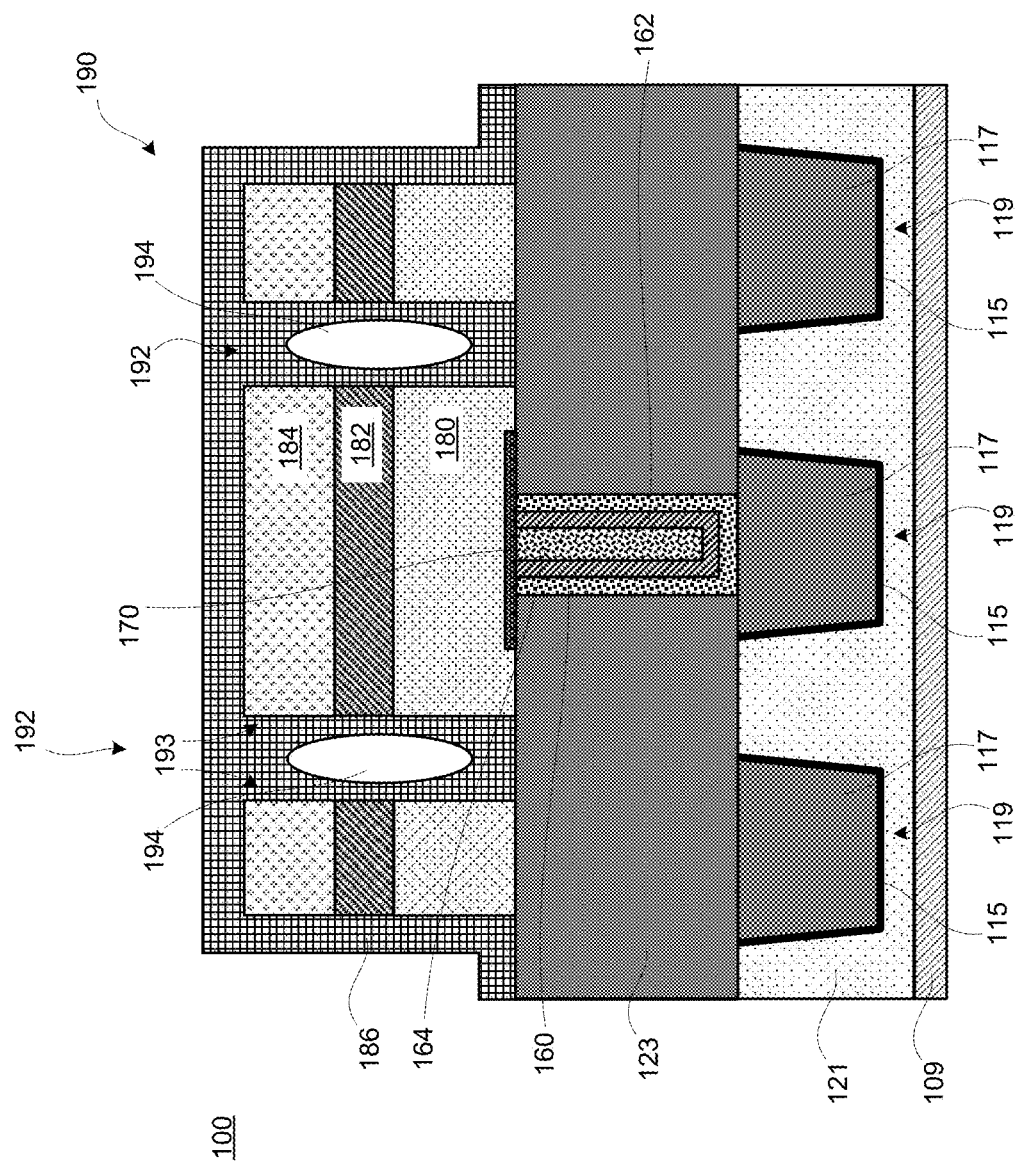

FIG. 9 depicts a cross-sectional view semiconductor device 100 shown after a respective fabrication operation(s). In the present fabrication operation(s), encapsulation layer 186 is partially formed within opening 192 such that one or more pores or airgap(s) 194 are formed therein. The portion of the encapsulation layer 186 that is formed within opening 192 is referred to herein as an encapsulation column.

The encapsulation column includes airgap 194 therewithin. The airgap 194 may be substantially vertically orientated within the encapsulation column, as depicted. Further, airgap 194 may be an elliptical oblong shaped airgap or air-pocket. Alternatively, airgap 194 may be a substantially vertical orientated upside-down triangular conical shaped airgap or air-pocket. The encapsulation layer 186 may be capable of capping the openings 192 to close the opening 192 inlet 193 that has a diameter D. In one embodiment, encapsulation layer 186 includes a filler material made of SiC, or the like. The dimension D is selected in conjunction with the conformal material which is to form the encapsulation layer 186. In one embodiment, encapsulation layer 186 is a conformal material layer which conforms generally to the interior of the opening 192 having the gap distance D. As encapsulation layer 186 conformally fills the opening 192 inlet 193, encapsulation layer 186 touches and creates a cap after which further filling of opening 192 is blocked, resulting in airgap 194.

Alternatively, the distance from dielectric 123 to the airgap 194 may be relatively small compared with the coverage capabilities of the encapsulation layer 186 resulting in the cap being formed almost immediately upon the deposition starting so that little to no material from the mask 186 enters the opening 192. Therefore, the top of the opening 192 will be essentially capped and maintain nearly the same open volume as when it was originally etched. There may be some small amount of encapsulation layer 186 deposited on the very bottom of the opening 192 with little deposited on the sides before the encapsulation layer 186 caps the inlet 193 of opening 192, thus sealing it off against further deposition of material. For layers which are very conformal, the distance from dielectric 123 to the airgap 194 may be somewhat smaller in order to ensure that a cap is formed to seal it off inlet 193 prior to completely filling the opening 192 to ensure that the airgap 194 remains. On the other hand, if the encapsulation layer 186 is not very conformal and tends to deposit more heavily at the corners and on the top, it may be permitted to have the distance between dielectric 123 and airgap 194 be a somewhat larger dimension and still be assured that the top will cap off while still leaving airgap 194 inside of opening 194. Accordingly, the dimension from dielectric 123 to airgap 194 is selected to ensure that adjacent encapsulation layer 186 will touch each other at the inlet 193 of the opening 192 to seal off the top and form a sealing cap before a central region of opening 192 is fully formed to ensure that the airgap 194 remains.

As previously mentioned, in some embodiments the selection of the width D together with the material used for the encapsulation layer 186 will result in a cap being formed at the inlet 193 of the opening 192 with little to no material of the encapsulation layer 186 in the opening 192, thus maintaining a larger airgap 194 and a correspondingly smaller dielectric constant. Since the dielectric constant of the air is 1.0 and it is substantially smaller than that of any other material, it may be desired to have the airgap 194 as large as practical within the constraints of the materials used and to provide sufficient structural integrity. In one embodiment, the material for the encapsulation layer 186 is silicon carbide which has a high physical strength and can be adjusted to be deposited to be ensured that it will build up at the inlet 193 of the opening 192 to create a cap that seals off the inlet 193 when the opening 192 is only partially filled with the encapsulation layer 186, thus ensuring that the airgap 194 will be present. By custom selection of the width D and the deposition properties of the encapsulation layer 186 material, a relatively large airgap 194 can be obtained, in some instances nearly the entire dimension of the original volume of the opening 192. As such, in embodiments, a pair of airgaps 194 associated with the pair of encapsulation columns may be located on the same diagonal bisector 153 and/or 155. For example, a respective center of a first pair of airgaps 194 associated with the first pair of encapsulation columns may be each coincident with diagonal bisector 153 and a respective center of a second pair of airgaps 194 associated with the second pair of encapsulation columns may be each coincident with diagonal bisector 155. Therefore, airgap 194 may be diagonally located (i.e., 45 degrees) between the top-down view vertical portion and the top-down view horizontal portion of the plus (+) shaped bottom electrode liner 170.

Figure 10:
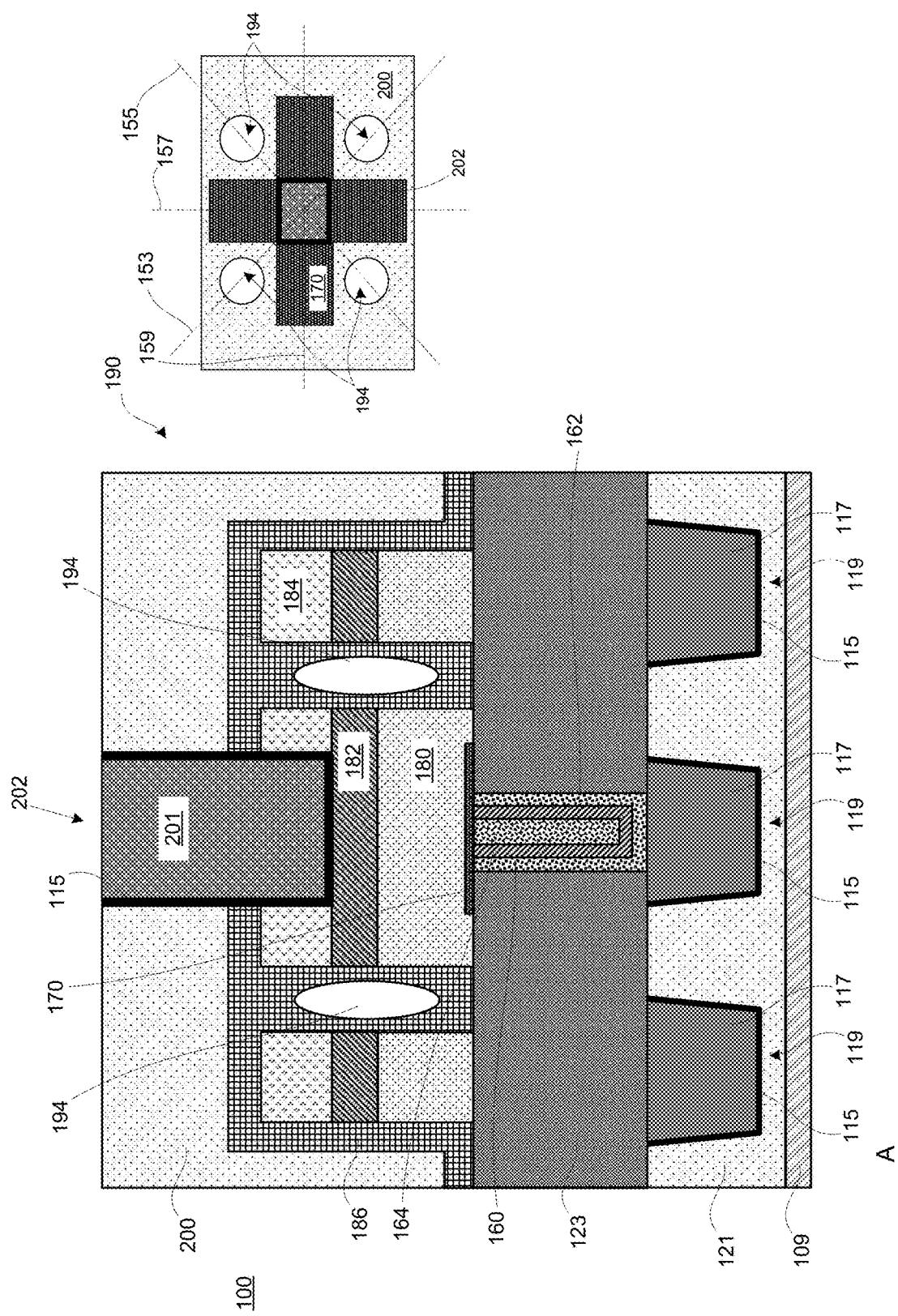
Figure 11:
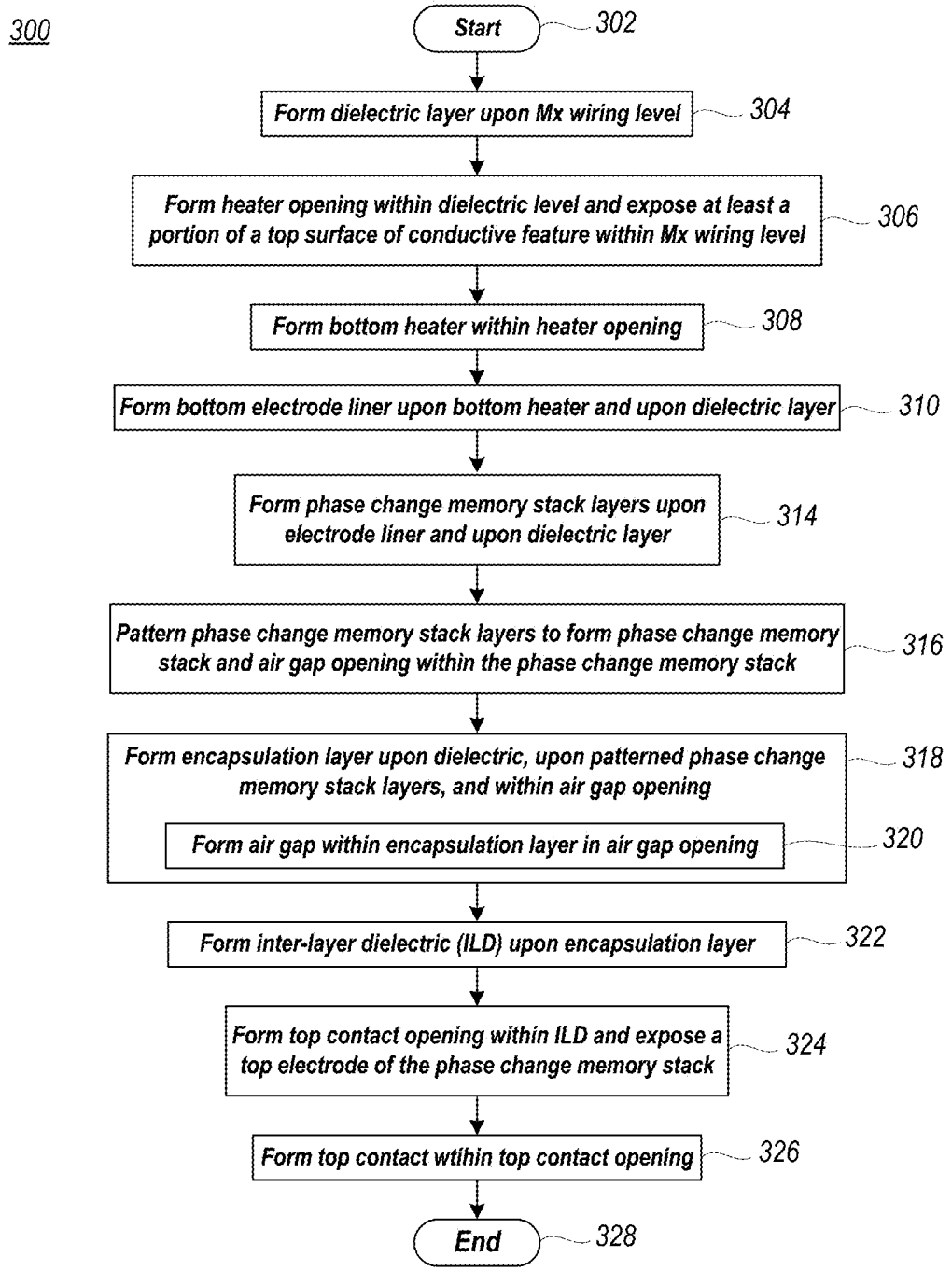
FIG. 11 is a flow diagram illustrating a semiconductor device fabrication method, in accordance with one or more embodiments.

FIG. 10 depicts a cross-sectional view semiconductor device 100 shown after a respective fabrication operation(s). In the present fabrication operation(s), ILD 200 is formed upon encapsulation layer 186, a top contact opening is formed within ILD 200, and a top contact 201 is formed within the top contact opening.

ILD 200 may be formed of any suitable dielectric material, for example, a TEOS oxide, low-k dielectric, or the like. The ILD 200 may be formed by any acceptable deposition process, such as spin coating, physical vapor deposition (PVD), chemical vapor deposition (CVD), the like, or a combination thereof.

The top contact opening may be formed within the ILD 200 by known photolithography, patterning, and/or etching techniques. The top contact opening may expose a portion of the top electrode 182. The top contact opening may be substantially vertically aligned with the center of bottom electrode liner 170. For example, the center of the top contact opening may be coincident with two or more of the diagonal bisectors 153, 155 and/or the bisectors 157, 159.

The top contact 202 may be formed of metals such as copper, aluminum, tungsten, cobalt, metal alloys thereof, or the like, within the top contact opening and upon the exposed portion of tope electrode 182. In some embodiments, top contact 202 may be located in the metallization layer Mx+1. Top contact 202 may be a contact plug, a metal line, a metal contact, a VIA, or the like. In some embodiments, top contact 202 may include conductive regions 201 and conductive barrier layer(s) 115 lining sidewalls and bottom surfaces of the conductive regions 201. The conductive barrier layer(s) 115 may be formed of titanium (Ti), titanium nitride (TiN), tantalum (Ta), tantalum nitride (TaN), cobalt (Co), a combination thereof, or the like. The conductive regions 201 may be formed of metals such as copper, aluminum, tungsten, cobalt, alloys thereof, or the like. The conductive regions 201 may also be conductive semiconductor materials such as a P-type doped semiconductor material, N-type doped semiconductor material, or the like.

In some implementations, a single conductive feature 201 may be formed and may be in a top metallization layer. In other implementations, the top contact 202 may be a vertical interconnect access (VIAs), metal wiring lines, or the like, which may be formed by etching the ILD 200, mask 184, and mask 184, etc. to form the top contact opening, forming conductive barrier layer(s) 115 extending into the top contact opening, depositing conductive region 201 material over the blanket conductive barrier layer(s) 115, and performing a planarization process, such as a CMP process or a mechanical grinding process, to remove excess portions of the blanket conductive barrier layer(s) 115 and the conductive region 201 material.

For clarity, semiconductor device 100 may include the PCM stack 190 that includes bottom electrode liner 170 over a lower heater 158. The bottom electrode liner 170 generally has a plus (+) geometry with a first top-down view horizontal portion being orthogonal to a second top-down view vertical portion, as is shown in the top-down views in the various figures of the drawings. An airgap 194 may be formed in each area located adjacent and between these horizontal portion(s) and the vertical portion(s). As each airgap 194 has a substantially smaller dielectric constant than the surrounding material(s), the airgap(s) 194 may effectively reduce the amount of current that leaks from the PCM stack 190 when flowing from the bottom electrode liner 170 to the top contact 202, or vice versa, as appropriate. As such, current flow between top contact 202 and bottom electrode liner 170 may be better confined through the PCM stack 190 relative to known PCM technologies. Further, airgaps 194 may allow for expansion of the surrounding material(s) that may be associated with the heating of the PCM stack 190 and/or the semiconductor device 100. A top of the airgap 194 may be above the top surface of top electrode 182 and a bottom of the airgap 194 may be between the top surface of dielectric layer 123 and the top surface of phase change memory material 180.

FIG. 10 is a flow diagram illustrating a semiconductor device fabrication method 300, in accordance with one or more embodiments. Method 300 may be utilized to fabricate semiconductor device 100. Method 300 begins at block 302 and may continue with forming a dielectric layer over an Mx wiring level (block 304). For example, dielectric layer 123 may be formed over and/or directly upon the top surface of Mx wiring level 102.

Method 300 may continue with forming a heater opening within the dielectric layer that exposes at least a portion of a top surface of a conductive feature within the Mx wiring level (block 306). For example, heater opening 146 is formed within the dielectric layer 123 that exposes a portion of the top surface of an underlying conductive feature 119 that is in Mx wiring level 102.

Method 300 may continue with forming a bottom heater within the heater opening (block 308). For example, bottom heater 158 is formed within the heater opening 140.

Method 300 may continue with forming a bottom projection liner electrode upon the dielectric layer and upon the bottom heater (block 310). For example, bottom electrode liner 170 may be formed upon the dielectric layer 123 and may be further formed upon the bottom heater 158. A center of the bottom electrode liner 170 may be at least substantially vertically aligned with a center of the underlying bottom heater 158.

Method 300 may continue with forming PCM stack layers upon the bottom projection liner electrode and upon the dielectric layer (block 314). For example, phase change material layer 180 is formed over the bottom electrode liner 170 and over the dielectric layer 123, a top electrode layer 182 is formed over the phase change material layer 180, and a mask layer 184 is formed over the top electrode layer 182.

Method 300 may continue with patterning a PCM stack from the PCM stack layers and with patterning one or more airgap opening(s) within the PCM stack (block 316). For example, PCM stack 190 may be patterned from the PCM stack layers 180, 182, and 184 and airgap opening 192 is patterned within the PCM stack 190.

Method 300 may continue with forming an encapsulation layer upon the dielectric layer, upon the PCM stack, and partially within the airgap opening (block 318). The encapsulation layer may be partially formed within the airgap opening to form an airgap within the airgap opening (block 320). For example, encapsulation layer 186 is formed upon dielectric layer 123, is formed upon PCM stack 190, and is partially formed within airgap opening 192 to form airgap 194 within airgap opening 192.

Method 300 may continue with forming an ILD upon the encapsulation layer (block 322). For example, ILD 200 may be formed upon the encapsulation layer 186. Method 300 may continue with forming a top contact opening within the ILD to expose at least a portion of the top electrode of the PCM stack (block 324). For example, a top contact opening may be formed within the ILD 200. The top contact opening may expose a portion of the upper surface of top electrode 182 of the PCM stack 190.

Method 300 may continue with forming a top contact within the top contact opening (block 326). For example, top contact 202 may be formed within the top contact opening and upon the expose portion of the top electrode 182 of PCM stack 190. The top contact 202 may be formed between a first pair of airgaps 194 located on a first diagonal bisector 153 and between a second pair of airgaps 194 located on a second diagonal bisector 155. A center of the top contact 202 may be at least substantially vertically aligned with the center of bottom heater 158. Method 300 may end at block 328.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

The invention claimed is:

1. A semiconductor device comprising:
a dielectric layer;
a bottom heater within the dielectric layer;
a phase change memory stack comprising a bottom projection liner electrode upon the dielectric layer and upon the bottom heater, a phase change memory material upon the bottom projection liner electrode, a top electrode upon the phase change memory material, an encapsulation column that extends from a top surface of the top electrode to a top surface of the dielectric layer, and an airgap within the encapsulation column.

2. The semiconductor device of claim 1, wherein the bottom projection liner electrode comprises a top-down view horizontal portion and a top-down view vertical portion that is orthogonal to the top-down view horizontal portion.

3. The semiconductor device of claim 2, wherein the exposed portion of the top surface of the dielectric layer is diagonally located between the top-down view horizontal portion and the top-down view vertical portion of the bottom projection liner electrode.

4. The semiconductor device of claim 3, wherein a top of the airgap is above a top surface of the top electrode.

5. The semiconductor device of claim 4, wherein a bottom of the airgap is between a top surface of the dielectric layer and a top surface of the phase change material.

6. The semiconductor device of claim 5, further comprising: a top contact directly upon the top electrode.

7. The semiconductor device of claim 6, wherein the top contact is vertically aligned with the bottom projection liner electrode.

8. A semiconductor device comprising:
a dielectric layer;
a bottom heater within the dielectric layer;
a phase change memory stack comprising a bottom projection liner electrode upon the dielectric layer and upon the bottom heater, the bottom projection liner electrode comprises a top-down view horizontal portion and a top-down view vertical portion that is orthogonal to the top-down view horizontal portion, a phase change memory material upon the bottom projection liner electrode, a top electrode upon the phase change memory material, a first pair of encapsulation columns that are diagonally located between the top-down view vertical portion and the top-down view horizontal portion of the bottom projection liner electrode, and a airgap within each of the first pair of encapsulation columns.

9. The semiconductor device of claim 8, wherein the phase change memory stack further comprises: a second pair of encapsulation columns diagonally located between the top-down view vertical portion and the top-down view horizontal portion of the bottom projection liner electrode.

10. The semiconductor device of claim 9, wherein a top of each airgap is above a top surface of the top electrode.

11. The semiconductor device of claim 10, wherein a bottom of each of airgap is between a top surface of the dielectric layer and a top surface of the phase change material.

12. The semiconductor device of claim 11, further comprising: a top contact directly upon the top electrode.

13. The semiconductor device of claim 12, wherein the top contact is vertically aligned with the bottom projection liner electrode.

14. A semiconductor device fabrication method comprising:
forming a heater within a dielectric layer;
forming a bottom projection liner electrode upon the heater and upon the dielectric layer;
forming a phase change memory upon the bottom projection liner electrode and upon the dielectric layer;
forming a top electrode upon the phase change memory;
forming an airgap opening entirely through the top electrode and entirely through the phase change memory to expose a portion of a top surface of the dielectric layer; and
forming an encapsulation layer within an inlet of the airgap opening to form an airgap within the airgap opening.

15. The semiconductor device fabrication method of claim 14, wherein the bottom projection liner electrode comprises a top-down view horizontal portion and a top-down view vertical portion that is orthogonal to the top-down view horizontal portion.

16. The semiconductor device fabrication method of claim 15, wherein the exposed portion of the top surface of the dielectric layer is diagonally located between the top-down view horizontal portion and the top-down view vertical portion of the bottom projection liner electrode.

17. The semiconductor device fabrication method of claim 16, wherein a top of the airgap is above a top surface of the top electrode.

18. The semiconductor device fabrication method of claim 17, wherein a bottom of the airgap is between a top surface of the dielectric layer and a top surface of the phase change material.

19. The semiconductor device fabrication method of claim 18, further comprising: forming a top contact directly upon the top electrode.

20. The semiconductor device fabrication method of claim 19, wherein the top contact is vertically aligned with the bottom projection liner electrode.

* * * * *